United States Patent
Choi et al.

(10) Patent No.: US 9,512,032 B2
(45) Date of Patent: Dec. 6, 2016

(54) GLASS FRIT, COMPOSITION FOR SOLAR CELL ELECTRODES INCLUDING THE SAME, AND ELECTRODE FABRICATED USING THE SAME

(71) Applicants: Young Wook Choi, Uiwang-si (KR); Eun Kyung Kim, Uiwang-si (KR); Ju Hee Kim, Uiwang-si (KR); Young Ki Park, Uiwang-si (KR); Dae Seop Song, Uiwang-si (KR); Jae Ho Kim, Uiwang-si (KR); Sang Hyun Yang, Uiwang-si (KR)

(72) Inventors: Young Wook Choi, Uiwang-si (KR); Eun Kyung Kim, Uiwang-si (KR); Ju Hee Kim, Uiwang-si (KR); Young Ki Park, Uiwang-si (KR); Dae Seop Song, Uiwang-si (KR); Jae Ho Kim, Uiwang-si (KR); Sang Hyun Yang, Uiwang-si (KR)

(73) Assignee: Cheil Industries, Inc., Gumi-Si, Kyeongsangbuk-do (KR)

( * ) Notice: Subject to any disclaimer, the term of this patent is extended or adjusted under 35 U.S.C. 154(b) by 53 days.

(21) Appl. No.: 14/133,763

(22) Filed: Dec. 19, 2013

(65) Prior Publication Data
US 2014/0175340 A1    Jun. 26, 2014

(30) Foreign Application Priority Data
Dec. 21, 2012   (KR) .................... 10-2012-0151431

(51) Int. Cl.
*C03C 3/00*    (2006.01)
*C03C 8/10*    (2006.01)
*C03C 8/04*    (2006.01)
(Continued)

(52) U.S. Cl.
CPC ................. *C03C 8/10* (2013.01); *C03C 3/062* (2013.01); *C03C 3/07* (2013.01); *C03C 3/122* (2013.01);
(Continued)

(58) Field of Classification Search
CPC ............ B22F 1/0059; B22F 7/04; B22F 7/08; C03C 8/04; C03C 8/10; C03C 3/068; C03C 3/122; H01L 31/022425
(Continued)

(56) References Cited

U.S. PATENT DOCUMENTS 6,266,181 B1 * 7/2001 Ohishi .................... C03C 3/122
                                                                    359/341.1
2008/0248941 A1 * 10/2008 Fu ........................... C03C 3/068
                                                                         501/50
(Continued)

FOREIGN PATENT DOCUMENTS

CN    10-1809758 A    8/2010
CN    10-1932535 A    12/2010
(Continued)

OTHER PUBLICATIONS

Chinese Office Action dated Mar. 2, 2016.
Taiwanese Office Action dated May 28, 2015.

*Primary Examiner* — Khanh Tuan Nguyen
(74) *Attorney, Agent, or Firm* — Lee & Morse, P.C.

(57) ABSTRACT

A glass frit includes at least three metal oxides selected from the group of lead oxide, silicon oxide, tellurium oxide, bismuth oxide, zinc oxide, and tungsten oxide, wherein the glass frit exhibits a phase transition peak in the range of about 300° C. to about 600° C. on a cooling curve obtained via an TG-DTA analysis while a mixture of the glass frit and silver powder, obtained by mixing the glass frit with the silver powder in a weight ratio of 1:1, is cooled at a cooling rate of 10° C./min, after heating the mixture to 850° C. at a heating rate of 20° C./min and held there for a wait-time of 10 minutes.

11 Claims, 1 Drawing Sheet

(51) Int. Cl.
- *C03C 3/062* (2006.01)
- *C03C 3/07* (2006.01)
- *C03C 3/12* (2006.01)
- *C03C 8/02* (2006.01)
- *C03C 8/18* (2006.01)
- *H01L 31/0224* (2006.01)

(52) U.S. Cl.
CPC . *C03C 8/02* (2013.01); *C03C 8/04* (2013.01); *C03C 8/18* (2013.01); *H01L 31/022466* (2013.01); *H01L 31/022483* (2013.01)

(58) Field of Classification Search
USPC .......... 252/182.1, 500, 301.4; 136/256; 359/341.1, 341.5; 501/37, 41, 50
See application file for complete search history.

(56) References Cited

U.S. PATENT DOCUMENTS

| | | | |
|---|---|---|---|
| 2011/0094578 A1* | 4/2011 | Akimoto | H01L 31/02242 136/256 |
| 2011/0232746 A1* | 9/2011 | Carroll | B22F 1/0059 136/256 |
| 2011/0308595 A1* | 12/2011 | Carroll et al. | 136/256 |

FOREIGN PATENT DOCUMENTS

| | | | | |
|---|---|---|---|---|
| CN | 102481521 A | 5/2012 | | |
| JP | S 6-236040 | * | 2/1987 | .............. C03C 8/24 |
| KR | 10-2010-0080616 A | 7/2010 | | |
| TW | 2011-25138 A | 7/2011 | | |
| TW | 201145311 A | 12/2011 | | |

* cited by examiner

GLASS FRIT, COMPOSITION FOR SOLAR CELL ELECTRODES INCLUDING THE SAME, AND ELECTRODE FABRICATED USING THE SAME

CROSS-REFERENCE TO RELATED APPLICATION

Korean Patent Application No. 10-2012-0151431, filed on Dec. 21, 2012, in the Korean Intellectual Property Office, and entitled: "Glass Frit, Composition For Solar Cell Electrodes Comprising The Same, and Electrode Fabricated Using The Same," is incorporated by reference herein in its entirety.

BACKGROUND

1. Field

Embodiments relate to a glass frit, a composition for solar cell electrodes including the same, and electrodes fabricated using the same.

2. Description of Related Art

Solar cells generate electricity using the photovoltaic effect of a p-n junction which converts photons of sunlight into electricity. In the solar cell, front and rear electrodes are formed on upper and lower surfaces of a semiconductor wafer or substrate with the p-n junctions, respectively. Then, the photovoltaic effect at the p-n junction is induced by sunlight entering the semiconductor wafer and electrons generated by the photovoltaic effect at the p-n junction provide electric current to the outside through the electrodes. The electrodes of the solar cell are formed on the wafer by applying, patterning, and baking an electrode composition.

SUMMARY

Embodiments are directed to a glass frit, including at least three metal oxides selected from the group of lead oxide, silicon oxide, tellurium oxide, bismuth oxide, zinc oxide, and tungsten oxide. The glass frit may exhibit a phase transition peak in the range of about 300° C. to about 600° C. on a cooling curve obtained via an TG-DTA analysis while a mixture of the glass frit and silver powder, obtained by mixing the glass frit with the silver powder in a weight ratio of 1:1, is cooled at a cooling rate of 10° C./min, after heating the mixture to 850° C. at a heating rate of 20° C./min and held there for a wait-time of 10 minutes.

The glass frit may be lead oxide-silicon oxide-tellurium oxide-zinc oxide glass frit, silicon oxide-tellurium oxide-bismuth oxide-zinc oxide-tungsten oxide glass frit, lead oxide-silicon oxide-tellurium oxide-zinc oxide-tungsten oxide glass frit, lead oxide-tellurium oxide-bismuth oxide glass frit, silicon oxide-tellurium oxide-zinc oxide-tungsten oxide glass frit, or a combination thereof.

The glass frit may include about 20 wt % to about 60 wt % of tellurium oxide.

The glass frit may include tellurium oxide, lead oxide, and bismuth oxide. A weight ratio of the tellurium oxide to the lead oxide may be about 1:0.1 to about 1:3, and a weight ratio of the tellurium oxide to the bismuth oxide may be about 1:0.1 to about 1:3.

Embodiments are also directed to a composition for solar cell electrodes, the composition including about 60 wt % to about 90 wt % of a conductive powder, about 1 wt % to about 10 wt % of a glass frit according to an embodiment, and about 5 wt % to about 30 wt % of an organic vehicle.

The conductive powder may include one or more of silver, gold, palladium, platinum, copper, chromium, cobalt, aluminum, tin, lead, zinc, iron, iridium, osmium, rhodium, tungsten, molybdenum, nickel, or indium tin oxide.

The glass frit may have an average particle diameter (D50) of about 0.1 μm to about 5 μm.

The composition may further include one or more of a dispersant, a thixotropic agent, a plasticizer, a viscosity stabilizer, an anti-foaming agent, a pigment, a UV stabilizer, an antioxidant, or a coupling agent.

Embodiments are also directed to a solar cell electrode prepared from a composition according to an embodiment.

Embodiments are also directed to a solar cell electrode, including metal oxide, the metal oxide consisting essentially of three or more of lead oxide, silicon oxide, tellurium oxide, bismuth oxide, zinc oxide, or tungsten oxide, and silver metal, wherein the silver metal is present in an amount of about 14 to about 99 wt % based on the total weight of the metal oxide and silver metal.

BRIEF DESCRIPTION OF DRAWINGS

Features will become apparent to those of skill in the art by describing in detail example embodiments with reference to the attached drawings in which.

DETAILED DESCRIPTION

Figure 1:
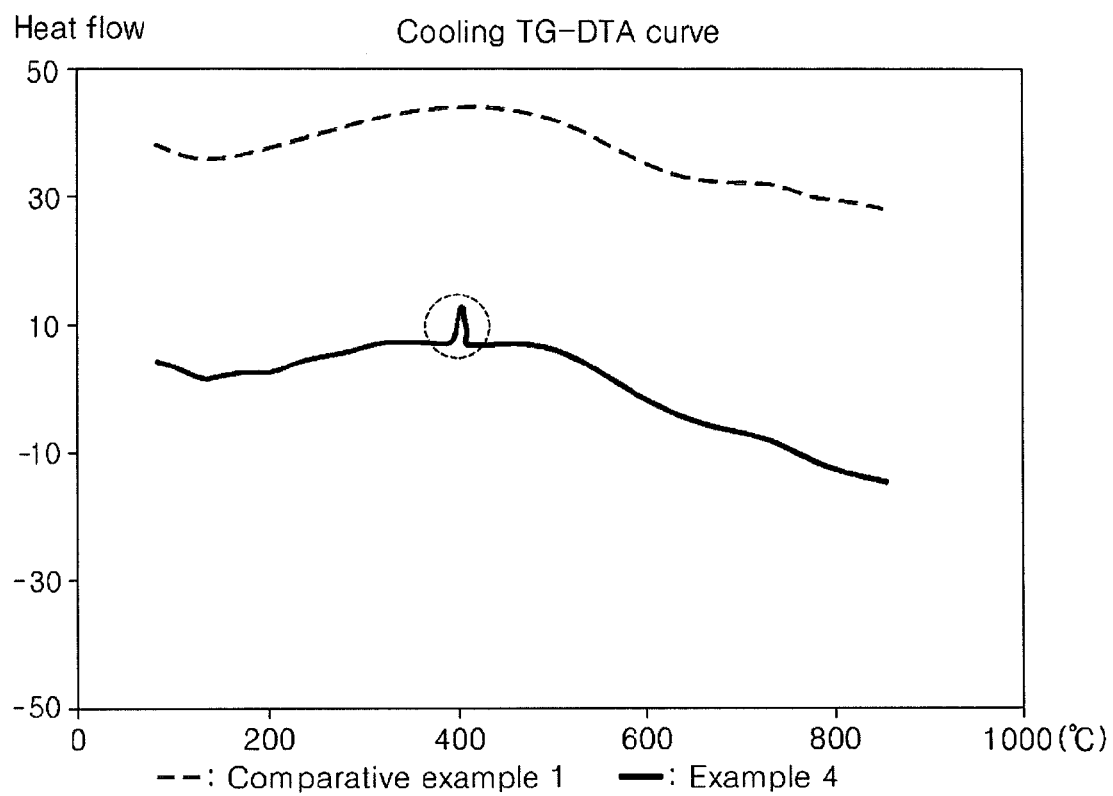
FIG. 1 illustrates a cooling curve, which is a DTA profile obtained by TG-DTA analysis of glass frits prepared in Example 4 and Comparative Example 1.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

Now, each component of the compositions for solar cell electrodes according to example embodiments will be described in more detail.

Glass Frit

The glass frit helps to enhance adhesion between the conductive powder and the wafer or the substrate, and helps to form silver crystal grains in an emitter region by etching an anti-reflection layer and melting the silver powder so as to reduce contact resistance during the baking process of the composition for electrodes. Further, during the baking process, the glass frit softens and decreases the baking temperature.

When the area of the solar cell is increased in order to improve solar cell efficiency, solar cell contact resistance may increase. Thus, it is desirable to minimize both serial resistance and influence on the p-n junction. In addition, as the baking temperature varies within a broad range with increasing use of various wafers having different sheet resistances, it is desirable that the glass frit secure sufficient thermal stability to withstand a wide range of baking temperatures.

According to an example embodiment, the glass frit may include at least one metal oxide, e.g., three or more, selected from the group consisting of lead oxide, silicon oxide, tellurium oxide, bismuth oxide, zinc oxide, and tungsten oxide.

In an example embodiment, the glass frit may include lead oxide-silicon oxide-tellurium oxide-zinc oxide (PbO—$SiO_2$—$TeO_2$—ZnO) glass frit, silicon oxide-tellurium oxide-bismuth oxide-zinc oxide-tungsten oxide ($SiO_2$—$TeO_2$—$Bi_2O_3$—ZnO—$WO_3$) glass frit, lead oxide-silicon oxide-tellurium oxide-zinc oxide-tungsten oxide (PbO—SiO$_2$—TeO$_2$—Bi$_2$O$_3$—ZnO—WO$_3$) glass frit, lead oxide-tellurium oxide-bismuth oxide (PbO—TeO$_2$—Bi$_2$O$_3$) glass frit, silicon oxide-tellurium oxide-zinc oxide-tungsten oxide (SiO$_2$—TeO$_2$—Bi$_2$O$_3$—ZnO—WO$_3$) glass frit, or a combination thereof.

The glass frit may include about 20 wt % to about 60 wt % of tellurium oxide. In an implementation, the glass frit may include tellurium oxide (TeO$_2$), lead oxide (PbO), and bismuth oxide (Bi$_2$O$_3$) in a weight ratio of tellurium oxide to lead oxide of about 1:0.1 to about 1:3, and a weight ratio of tellurium oxide to bismuth oxide of about 1:0.1 to about 1:3. Within this range, it may be possible to secure stability of a p-n junction given varying surface resistances and to minimize serial resistance.

The glass frit may be prepared from such metal oxides by a suitable method, e.g., the metal oxides may be mixed in a predetermined ratio using, e.g., a ball mill or a planetary mill, the mixture may be melted at about 900° C. to about 1300° C., followed by quenching to about 25° C., and the obtained resultant may be subjected to pulverization under a disk mill, a planetary mill, or the like, thereby preparing the glass frit.

The glass frit may have an average particle diameter (D50) of about 0.1 μm to about 5 μm, e.g., about 0.5 μm to about 3 μm. Within this range, the glass frit may avoid obstructing deep curing when using UV irradiation and may avoid producing pinhole failures, which may occur in a developing process in fabrication of electrodes.

The average particle diameter of the glass frit may be measured using, e.g., a Model 1064D (CILAS Co., Ltd.) after dispersing the glass frit in isopropyl alcohol (IPA) at room temperature for 3 minutes via ultrasonication.

According to an example embodiment, a test mixture of the glass frit and silver (Ag) powder in a weight ratio of about 1:1 exhibits a phase transition peak (at which an Ag-crystallite is formed in a DTA profile) within a range from about 300° C. to about 600° C., e.g., from about 350° C. to about 550° C., in TG-DTA analysis. In an example, the glass frit is mixed with the silver powder in a weight ratio of 1:1, and the resulting mixture is heated to 850° C. at a heating rate of 20° C./min, followed by a wait-time of 10 minutes. While the mixture is cooled at a cooling rate of 10° C./min, the phase change peak temperature (at which an Ag-crystallite is formed) is measured via TG-DTA analysis. FIG. 1 illustrates a cooling curve, which is a DTA profile obtained by TG-DTA analyses of glass frits prepared in Example 4 and Comparative Example 1. Referring to FIG. 1, the glass frit according to an Example in accordance with an embodiment has a phase change peak (at which an Ag-crystallite is formed) within a range from about 300° C. to about 600° C. on a cooling curve in TG-DTA analysis.

Composition for Solar Cell Electrodes

A composition for solar cell electrodes according to an example embodiment includes a conductive powder (A); a glass frit (B); an organic vehicle (C); and an additive (D).

(A) Conductive Powder

Examples of the conductive powder may include one or more of silver (Ag), gold (Au), palladium (Pd), platinum (Pt), copper (Cu), chromium (Cr), cobalt (Co), aluminum (Al), tin (Sn), lead (Pb), zinc (Zn), iron (Fe), iridium (Ir), osmium (Os), rhodium (Rh), tungsten (W), molybdenum (Mo), and nickel (Ni) powders, etc. These conductive powders may be used alone or as a mixture or alloy of two or more thereof. In an implementation, the conductive powder includes silver metal, e.g., silver powder. In some example embodiments, the conductive powder may include silver powder and one or more of nickel (Ni), cobalt (Co), iron (Fe), zinc (Zn), or copper (Cu) powders.

The conductive powder may have, e.g., a spherical, flake, or amorphous particle shape.

The conductive powder may be a mixture of conductive powders having different particle shapes.

The conductive powder may have an average particle size (D50) of about 0.1 μm to about 5 μm. The average particle size may be measured using, e.g., a Model 1064D particle size analyzer (CILAS Co., Ltd.) after dispersing the conductive powder in isopropyl alcohol (IPA) at 25° C. for 3 minutes via ultrasonication. Within this range of average particle size, the paste composition may provide low contact resistance and line resistance. In an implementation, the conductive powder has an average particle size (D50) of about 0.5 μm to about 2 μm.

The conductive powder may be a mixture of conductive particles having different average particle sizes (D50).

The conductive powder may be present in an amount of about 60 wt % to about 90 wt % in the composition for solar cell electrodes. Within this range, the conductive powder may help prevent deterioration in conversion efficiency of a solar cell due to resistance increase and difficulty in forming the paste due to relative reduction in amount of the organic vehicle. In an implementation, the conductive powder is present in an amount of about 70 wt % to about 88 wt %.

(B) Glass Frit

As described above, a mixture of the glass frit and the silver (Ag) powder in a weight ratio of about 1:1 exhibits a phase transition peak within a range from about 300° C. to about 600° C. on a cooling curve in TG-DTA analysis. The glass frit may be present in an amount of about 1 wt % to about 10 wt % in the composition for solar cell electrodes. Within this range, it may be possible to improve sintering properties and adhesion of the conductive powder while preventing deterioration in conversion efficiency due to resistance increase. Further, it may be possible to prevent an excess of the glass frit from remaining after baking, which may cause resistance increase and wettability deterioration. In an implementation, the glass frit is present in an amount of about 1 wt % to about 7 wt %.

(C) Organic Vehicle

The organic vehicle may include an organic binder which provides liquidity to the composition for solar cell electrodes.

Examples of the organic binder include cellulose polymers, such as ethylcellulose, hydroxyethylcellulose, hydroxypropylcellulose, hydroxyethylhydroxypropylcellulose, and the like; acrylic copolymers obtained by copolymerization with hydrophilic acrylic monomers such as carboxyl groups; and polyvinyl resins, etc. These binders may be may be used alone or in combination thereof.

The organic vehicle may further include a solvent. In this case, the organic vehicle may be a solution prepared by dissolving the organic binder in the solvent. The organic vehicle may include about 5 wt % to about 40 wt % of the organic binder and about 60 wt % to about 95 wt % of the solvent. The organic vehicle may include about 6 wt % to about 30 wt % of the organic binder and about 70 wt % to about 94 wt % of the solvent.

The solvent may be an organic solvent having a boiling point of about 120° C. or more. The solvent may be selected from the group of carbitol solvents, aliphatic alcohols, ester solvents, cellosolve solvents, and hydrocarbon solvents, which are generally used in the production of electrodes. Examples of solvents suitable for use in the paste composition include butyl carbitol, butyl carbitol acetate, methyl cellosolve, ethyl cellosolve, butyl cellosolve, aliphatic alcohols, terpineol, ethylene glycol, ethylene glycol monobutyl ether, butyl cellosolve acetate, Texanol, and mixtures thereof.

The organic vehicle may be present in an amount of about 5 wt % to about 30 wt % in the composition. Within this range, it may be possible to prevent inefficient dispersion or excessive increase in viscosity after preparation of the composition, which may lead to printing difficulty, and to prevent resistance increase, etc., which may occur during the baking process. In an implementation, the organic vehicle is present in an amount of about 10 wt % to about 25 wt %.

(D) Additives

The composition may further include general additives to enhance flow properties, process properties, and stability, as desired. The additives may include dispersants, thixotropic agents, plasticizers, viscosity stabilizers, anti-foaming agents, pigments, UV stabilizers, antioxidants, coupling agents, etc. These additives may be used alone or as mixtures thereof. These additives may be present in an amount of, e.g., about 0.1 wt % to about 5 wt % in the composition.

Solar Cell Electrode and Solar Cell Including the Same

Figure 2:
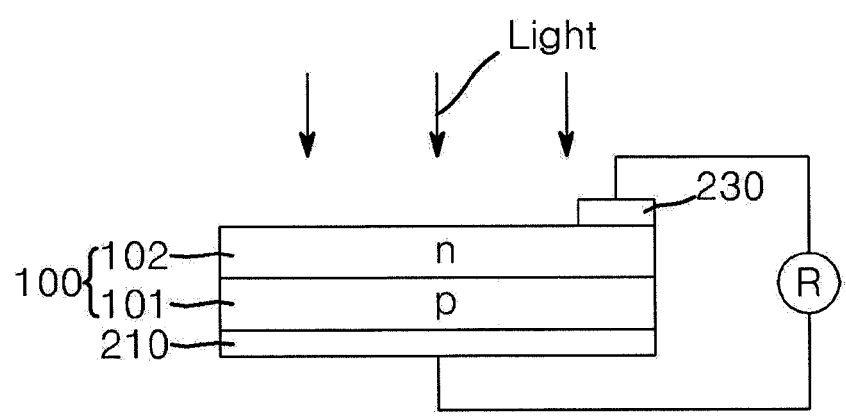
FIG. 2 illustrates a schematic view of a solar cell in accordance with an example embodiment.

Other example embodiments relate to an electrode formed of the composition for solar cell electrodes and a solar cell including the same. FIG. 2 illustrates a solar cell in accordance with an example embodiment.

Referring to FIG. 2, a rear electrode 210 and a front electrode 230 may be formed by printing and baking the composition for solar cell electrodes according to an embodiment on a wafer or substrate 100 that includes a p-layer 101 and an n-layer 102, which will serve as an emitter. For example, a preliminary process for preparing the rear electrode 210 is performed by printing the composition on the rear surface of the wafer 100 and drying the printed composition at about 200° C. to about 400° C. for about 10 seconds to about 60 seconds. Further, a preliminary process for preparing the front electrode may be performed by printing the paste on the front surface of the wafer and drying the printed composition. Then, the front electrode 230 and the rear electrode 210 may be formed by baking the wafer at about 400° C. to about 950° C., preferably at about 850° C. to about 950° C., for about 30 seconds to about 50 seconds.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Description of details apparent to those skilled in the art may be omitted.

EXAMPLES

Preparation of Glass Frit

Metal oxides were mixed in compositions (unit: wt %) as listed in Table 1. The mixture was melted at 1200° C., followed by quenching to 25° C. The obtained resultant was subjected to pulverization under a disk mill, thereby preparing glass frits (GF1 to GF7) having an average particle diameter of 2 μm.

TG-DTA Analysis of Glass Frit

The prepared glass frits were mixed with silver (Ag) powder (Dowa 5-11F) in a weight ratio of 1:1. The resulting mixture was heated to 850° C. at a heating rate of 20° C./min using an alumina pan P/N SSC515D011 and EXSTAR 6200 (EXSTAR Co., Ltd.), followed by a wait-time of ten minutes. While the mixture was cooled at a cooling rate of 10° C./min, a phase change peak temperature, at which an Ag-crystallite is formed, was measured via TG-DTA analysis. Measurement results are shown in Table 1.

TABLE 1

|  |  | GF 1 | GF 2 | GF 3 | GF 4 | GF 5 | GF 6 | GF 7 |
|---|---|---|---|---|---|---|---|---|
| Composition of glass frit (wt %) | PbO | 55.0 | — | 10.0 | 45.0 | — | 85.0 | 50.0 |
|  | $SiO_2$ | 10.0 | 7.0 | 7.0 | — | 7.0 | 10.0 | 20.0 |
|  | $TeO_2$ | 25.0 | 27.0 | 27.0 | 48.0 | 37.0 | — | 15.0 |
|  | $Bi_2O_3$ | — | 50.0 | 40.0 | 7.0 | 40.0 | — | — |
|  | ZnO | 10.0 | 6.0 | 6.0 | — | 6.0 | — | 10.0 |
|  | $Al_2O_3$ | — | — | — | — | — | 5.0 | 5.0 |
|  | $WO_3$ | — | 10.0 | 10.0 | — | 10.0 | — | — |
| TG-DTA analysis | Ag powder (wt %) | 50 | 50 | 50 | 50 | 50 | 50 | 50 |
|  | Glass frit (wt %) | 50 | 50 | 50 | 50 | 50 | 50 | 50 |
|  | Phase transition temp. (° C.) | 420 | 483 | 437 | 407 | 560 | — | — |

Examples 1 to 5 and Comparative Examples 1 to 2

Preparation of Composition for Solar Cell Electrodes

As shown in Table 2, 9 g of an organic vehicle obtained by dissolving 1 g of ethylcellulose in 8 g of butyl carbitol, and 89 g of silver powder (Dowa 5-11F, Dowa Hightech Co., Ltd.) were added to 2 g of the prepared glass frits GF1 to GF7, respectively, followed by mixing and kneading in a 3-roll kneader, thereby preparing a composition for solar cell electrodes.

Property Evaluation of Electrodes

Each of the prepared composition was deposited on a screen print plate by rolling a scrapper thereon. Each composition was printed on a mono-crystalline wafer having an average surface resistance of 65Ω while squeezing the paste composition to an image area of the screen print plate. The printed wafer was dried at 300° C. for 20 seconds to 30 seconds and then, subjected to baking in a BTU baking furnace at a 6-zone temperature of 950° C. and a belt speed of 250 rpm. After baking, serial resistance (Ω) was measured using a PASSAN cell tester. The measured serial resistances are shown in Table 2.

TABLE 2

|  | Example 1 | Example 2 | Example 3 | Example 4 | Example 5 | Comparative Example 1 | Comparative Example 2 |
|---|---|---|---|---|---|---|---|
| Glass frit | GF 1 | GF 2 | GF 3 | GF 4 | GF 5 | GF 6 | GF 7 |
| Ag powder (wt %) | 89 | 89 | 89 | 89 | 89 | 89 | 89 |
| Glass frit (wt %) | 2 | 2 | 2 | 2 | 2 | 2 | 2 |

TABLE 2-continued

|  | Example 1 | Example 2 | Example 3 | Example 4 | Example 5 | Comparative Example 1 | Comparative Example 2 |
|---|---|---|---|---|---|---|---|
| Organic vehicle (wt %) | 9 | 9 | 9 | 9 | 9 | 9 | 9 |
| Serial resistance (mΩ) | 15.3 | 12.8 | 9.7 | 5.5 | 20.6 | 68.5 | 50.8 |

As shown in Table 2, it may be seen that the compositions prepared in Examples 1 to 5 had much lower serial resistance than the compositions prepared in Comparative Examples 1 to 2. Here, the glass frits GF1 to GF5 used in Examples 1 to 5 had a phase transition peak (at which Ag-crystals are formed) in the range of 300° C. to 600° C. on a DTA profile in TG-DTA analysis, whereas the glass frits GF6 to GF7 used in Comparative Examples 1 to 2 did not exhibit the phase transition peak in the range of 300° C. to 600° C.

By way of summation and review, reductions in emitter thickness to improve solar cell efficiency may cause shunting that may deteriorate solar cell performance. In addition, solar cells have gradually been increased in size to help achieve higher efficiency, although efficiency may be hampered by an increase in solar cell contact resistance.

In addition, baking temperatures may vary within a broad range with increasing use of various wafers having different sheet resistances. Thus, it is desirable that the glass frit exhibit sufficient thermal stability to withstand a wide range of baking temperatures.

Solar cell efficiency may be improved and the p-n junction may be stabilized by using a composition for solar cell electrodes that helps minimize adverse influence on the p-n junction given varying surface resistances.

As described above, an example embodiment relates to a composition for solar cell electrodes, which may provide stable efficiency given varying surface resistance and minimize adverse influence on a p-n junction while minimizing serial resistance.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope as set forth in the following claims.

What is claimed is:

1. A glass frit, comprising:
   20 wt % to 60 wt % of tellurium oxide;
   zinc oxide;
   lead oxide; and
   bismuth oxide; and
   optionally silicon oxide; and
   optionally tungsten oxide;

wherein:
   the glass frit exhibits a phase transition peak in the range of 300° C. to 600° C. on a cooling curve obtained via an TG-DTA analysis while a mixture of the glass frit and silver powder, obtained by mixing the glass frit with the silver powder in a weight ratio of 1:1, is cooled at a cooling rate of 10° C./min, after heating the mixture to 850° C. at a heating rate of 20° C./min and held there for a wait-time of 10 minutes,
   a weight ratio of the tellurium oxide to the lead oxide is 1:0.1 to 1:3, and a weight ratio of the tellurium oxide to the bismuth oxide is 1:0.1 to 1:3, and
   the amount of zinc oxide is 6 to 10 wt % of the glass frit.

2. A composition for solar cell electrodes, the composition comprising:
   60 wt % to 90 wt % of a conductive powder;
   1 wt % to 10 wt % of the glass frit as claimed in claim 1; and
   5 wt % to 30 wt % of an organic vehicle.

3. The composition as claimed in claim 2, wherein the conductive powder includes at least one selected from the group consisting of silver, gold, palladium, platinum, copper, chromium, cobalt, aluminum, tin, lead, zinc, iron, iridium, osmium, rhodium, tungsten, molybdenum, nickel, and indium tin oxide.

4. The composition as claimed in claim 2, wherein the glass frit has an average particle diameter (D50) of 0.1 μm to 5 μm.

5. The composition as claimed in claim 2, further comprising at least one additive selected from the group consisting of a dispersant, a thixotropic agent, a plasticizer, a viscosity stabilizer, an anti-foaming agent, a pigment, a UV stabilizer, an antioxidant, and a coupling agent.

6. A solar cell electrode prepared from the composition as claimed in claim 2.

7. The glass fit as claimed in claim 1, comprising 25 wt % to 48 wt % of tellurium oxide.

8. The glass frit as claimed in claim 1, wherein the glass frit is a lead oxide-silicon oxide-tellurium oxide-bismuth oxide-zinc oxide glass frit.

9. The glass frit as claimed in claim 1, wherein the glass frit is a lead oxide-tellurium oxide-bismuth oxide-zinc oxide-tungsten oxide glass fit.

10. The glass frit as claimed in claim 1, wherein the glass fit is a lead oxide-silicon oxide-tellurium oxide-bismuth oxide-zinc oxide-tungsten oxide glass fit.

11. The glass frit as claimed in claim 1, wherein the glass frit is a lead oxide-tellurium oxide-bismuth oxide-zinc oxide glass fit.

* * * * *